United States Patent

Kuzmin et al.

[11] Patent Number: 5,930,114
[45] Date of Patent: Jul. 27, 1999

[54] HEAT SINK MOUNTING ASSEMBLY FOR SURFACE MOUNT ELECTRONIC DEVICE PACKAGES

[75] Inventors: Gary F. Kuzmin, Plano; Donald Lynn Clemens, The Colony, both of Tex.

[73] Assignee: Thermalloy Incorporated, Dallas, Tex.

[21] Appl. No.: 08/955,640

[22] Filed: Oct. 23, 1997

[51] Int. Cl.[6] ..................................................... H05K 7/20
[52] U.S. Cl. ...................... 361/704; 361/707; 361/709; 361/710; 361/719; 257/717; 257/718; 257/719; 257/726; 257/727; 165/80.2
[58] Field of Search .................................. 361/704, 707, 361/709, 710, 717, 718, 719, 720; 257/718, 719; 165/80.3, 185

[56] References Cited

U.S. PATENT DOCUMENTS 4,235,285  11/1980  Johnson et al. ........................ 165/80.3
4,625,260  11/1986  Jordan et al. .......................... 361/720
5,365,399  11/1994  Kent et al. .............................. 361/704

*Primary Examiner*—Leo P. Picard
*Assistant Examiner*—Boris L. Chervinsky
*Attorney, Agent, or Firm*—Locke Liddell & Sapp LLP

[57] ABSTRACT

A mounting assembly for thermally coupling a heat sink to a surface mounted heat generating electronic device package. The mounting assembly essentially comprises a heat generating device package, a mounting attachment, and a heat sink. The mounting attachment and heat generating device package are surface mounted to a PCB or other substrate in mutual thermal communication with a thermal pad on the substrate. The mounting attachment is adapted to facilitate the effective dissipation of heat from surface mounted heat generating electronic device packages while allowing for the post-manufacture installation and exchange of heat sinks.

22 Claims, 2 Drawing Sheets

HEAT SINK MOUNTING ASSEMBLY FOR SURFACE MOUNT ELECTRONIC DEVICE PACKAGES

FIELD OF THE INVENTION

The present invention relates to a mounting assembly for thermally coupling a heat sink to a surface mounted heat generating device package. More particularly, it relates to a mounting attachment for releasably securing a heat sink in thermal communication with a heat generating device package, where the heat generating device package and mounting attachment are surface mounted to a printed circuit board or other substrate.

BACKGROUND OF THE INVENTION

Many electronic devices and electrical systems, such as transistors, integrated circuits, power controls, switches, microprocessors, and the like, generate heat during operation. The capability of some electronic devices is limited by their ability to remove or expel internally generated heat. This heat must be removed from the device to avoid general or localized thermal degradation or failure of the device. In some devices, the heat generated is dissipated sufficiently by the enclosure, package, header, or leads. Other devices require additional apparatus, such as heat sinks, for removing and dissipating excess thermal energy.

For purposes of the present invention, a heat sink is any body of metal or like material which is placed in thermal communication with an electronic device package or other heat generating component for transferring internally generated heat from the device and for rapidly dissipating this heat to the surrounding environment by conduction, convection, and/or radiation. In order to accomplish this, heat sinks are generally made of materials having high coefficients of thermal conduction such as aluminum, copper, and alloys thereof. Heat sinks may be extruded, machined, molded, sawed, or formed of sheet metal bodies. A typical heat sink for electrical applications functions by conducting heat away from the heat generating component and dissipating the heat into the surrounding air. Accordingly, heat sinks are typically shaped to maximize surface area by incorporating fins or pins. Increased surface area maximizes heat dissipation from the heat sink to the surrounding atmosphere.

In order for the heat sink to operate efficiently, it must be secured to, or otherwise placed in good thermal communication with, the heat generating device. Various means have been used to attach heat sinks in thermal communication with heat generating device packages. A known practice is to glue or otherwise adhesively attach a heat sink directly to a predetermined surface of the heat generating device package with heat-conductive epoxy, thermally enhanced adhesives, solder, or the like. Heat sinks may also be mechanically attached to electronic device packages with resilient metal clips mounted on the heat sink or with screws, bolts, clamps, or other connective means which urge the heat sink and electronic device package into mutual contact. In addition, heat sinks may be remotely located but thermally coupled to a heat generating device via a heat spreader device, a heat pipe, or any other means of transferring heat from the source of the heat to the heat sink.

Recently, technological advances have allowed electronic components to decrease in size while increasing in power and speed. This miniaturization of electronic components with increased capability has resulted in the generation of more heat in less space with the electronic device packages having less physical structure for dissipating heat and less surface area for attaching a heat sink to dissipate the heat. A heat spreader can be used to increase the surface area for transferring heat. Such a heat spreader serves to disperse the heat generated by the electronic device throughout a larger physical structure than the device or device package, thus allowing the device to dissipate the heat through the increased surface area or providing greater surface area to attach a larger heat sink in thermal communication with the electronic device package.

Further complicating modern electronic thermal management is the growing preference for surface mounting electronic components on printed circuit boards (PCBs) or other substrates. The use of surface mount PCBs is desirable because this is a less costly and less time consuming process of fabricating and populating PCBs than the older manufacturing assembly process which required insertion of components through holes in the circuit board for subsequent soldering operations. Surface mount PCBs allow for increased use of automated manufacturing and assembly techniques. In particular, surface mountable devices are typically robotically picked and placed on the PCB and then soldered to the PCB in one automated manufacturing process. In addition to reducing assembly costs, the surface mount technology has allowed for even greater miniaturization of the electronic device packages used on the boards. These smaller packages further reduce the device's ability to dissipate its own heat thus increasing the need for separate heat sinks. The smaller packages, however, also make it increasingly difficult to attach a heat sink directly to the device package.

Several methods have been suggested to dissipate heat from these surface mount electronic device packages. One common approach is to use the ground plane, or other similar thermally conductive area of the PCB, as a rudimentary heat sink to spread and dissipate the heat. Although this may provide adequate dissipation of the heat generated, it typically requires significant board space, thereby increasing the size of the PCB or limiting the available PCB space for populating the PCB, both of which are undesirable side effects.

An alternative to using a portion of the PCB as a heat sink is to use larger device packages thereby providing greater surface area to dissipate the heat directly from the device package. In addition, such larger packages often provide improved means for mounting a separate heat sink directly to the package. Again, however, the use of such larger device packages and the use of separate heat sinks often require relatively large amounts of board space. This also runs contrary to the general desire to miniaturize electronic components. Another disadvantage is that the separate heat sink typically must be attached to the device package after the majority of the PCB has been soldered in an automated manufacturing process. Adding an additional step to the manufacturing process increases assembly time and costs.

Alternatively, a combination of the two concepts has been suggested wherein the surface mount device package is thermally connected to a smaller thermal plane, thermal pad, or thermal land on the PCB. A heat sink can then be soldered to the thermal pad in indirect thermal communication with the heat generating device. This alternative reduces the amount of PCB space used and eliminates the post assembly soldering of the heat sink to the PCB. One example of this technique is shown in U.S. Pat. No. 5,365,399 issued to K. Kent and J. Glomski on Nov. 15, 1994 entitled "Heat Sinking Apparatus for Surface Mountable Power Devices." One disadvantage to this method is the fact that the size of the heat sink must be limited so that the heat sink can be heated during manufacture to allow for reflow of the solder during the typical surface mount solder manufacturing process. By limiting the size or mass of the heat sink, the amount of heat dissipation is also limited.

In addition, soldering the heat sink to the PCB means the heat sink can not easily be removed from the PCB. Thus, the heat sink cannot be exchanged for different size heat sinks. The ability to interchange heat sinks is desirable because different size heat sinks may be utilized depending on the circumstances. For instance, a larger heat sink may be needed if the heat generating device is generating more heat than expected, or the heat sink is dissipating less heat than expected. Conversely, if the device is not generating as much heat as expected, or the heat sink is dissipating more heat than expected, a smaller heat sink may be used to further reduce the size of the electronic component. In addition, differing sized heat sinks may be required to compensate for different environments in which the PCB may be placed. For example, environments with high ambient temperatures or poor ventilation may require larger heat sinks.

Although the '399 patent contemplates the addition of heat sink extensions to create various sizes of heat sinks, it does not provide an efficient solution to the problem. The '399 patent discloses slots in the main body of the heat sink which allow for the insertion of a spring clip heat sink extension. The spring clip heat sink extension and slot disclosed, however, provide a relatively poor thermal connection to the heat sink which limits the effectiveness of the heat sink extension. In addition, spring means must be incorporated into the heat sink extension in order to attach the extension to the heat sink. This limits the shape, size, and materials which may be used as heat sink extensions.

SUMMARY OF THE INVENTION

In accordance with the present invention, there is provided a novel heat sink mounting assembly having a mounting attachment for releasably securing a heat sink to a PCB or other substrate in good thermal communication with a heat generating device package. The heat generating device package and mounting attachment are surface mounted to the substrate during the solder manufacturing assembly process, whereas the heat sink may be installed and exchanged after manufacture of the PCB. The mounting attachment is designed with a small mass so that it can be easily heated and soldered to the PCB during manufacturing while allowing for the subsequent attachment of heat sinks of varying shapes, sizes, and materials.

The inventive heat sink mounting assembly comprises a substrate; a thermal pad supported by the substrate; a heat generating device package surface mounted to the substrate and thermally coupled to the thermal pad; a heat sink mounting attachment surface mounted to the substrate in thermal communication with the thermal pad, having a body supported above the substrate by at least one support member extending generally downward from the body, wherein the support member comprises a leg extending from the body, a foot extending generally perpendicularly from the leg, and a spring clip extending generally upward from the foot; and a heat sink having at least one extension thermally coupled to the mounting attachment by sliding the extension into the support member biasing the leg and the spring clip of the support member such that the heat sink extension is held between the leg and the spring clip.

Alternatively, the heat sink extension may incorporate the leg, foot, and spring clip in a generally U-shaped configuration, and the support member may comprise a generally planar member, wherein the support member is thermally coupled to the extension by sliding the support member into the extension thereby biasing the leg and spring clip of the extension such that the support member is held therebetween. This embodiment further reduces the mass and complexity of the heat sink mounting attachment making it even easier to surface mount to the PCB during the automated solder manufacturing process.

In another alternate embodiment, the heat sink mounting assembly comprises a substrate; a thermal pad supported by the substrate; a heat generating device package surface mounted to the substrate having a heat dissipating tab, the heat generating device thermally coupled to the thermal pad; a heat sink mounting attachment surface mounted to the substrate in thermal communication with the thermal pad, having a body supported above the substrate by at least one support member extending from said body; an overhang extending from the body of the mounting attachment thermally connecting the mounting attachment to the tab of the heat generating electronic device; and a heat sink thermally coupled to the mounting attachment.

Various embodiments of the present invention are more completely described below in reference to the drawings.

BRIEF DESCRIPTION OF THE DRAWINGS

The invention can be more fully understood by referencing the accompanying drawings wherein.

DETAILED DESCRIPTION OF THE DRAWINGS

Figure 1:
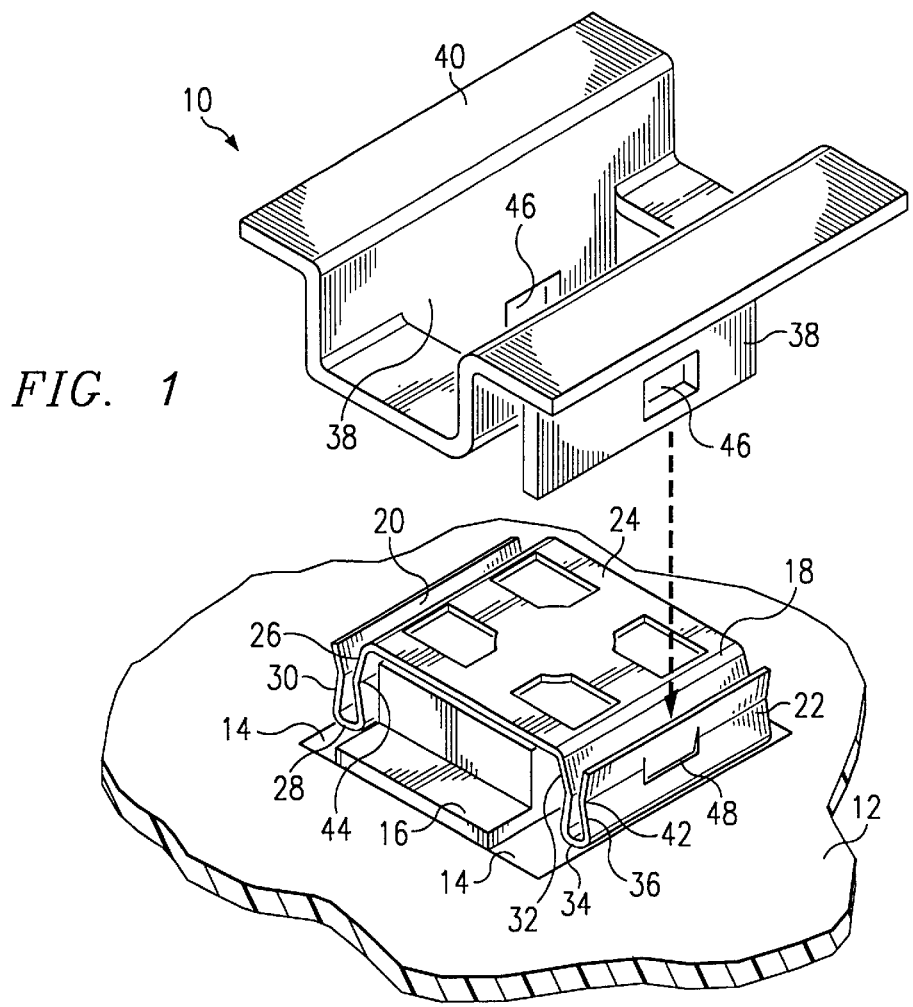
FIG. 1 is a perspective view of an embodiment for the mounting assembly of the present invention.

Referring now to the drawings, wherein like reference characters denote corresponding parts:

A heat sink mounting assembly in accordance with the present invention is illustrated in FIG. 1. As shown in FIG. 1, the embodiment of the mounting assembly 10 comprises a substrate 12 having a thermal pad 14 supported thereon. The substrate 12 is typically a PCB or some similar generally planar surface used for surface mounting electronic devices. The thermal pad 14 is typically formed on the surface of the substrate 12 and is made of materials having a high coefficient of thermal conductivity such as copper. In addition, the thermal pad 14 should be made of materials which allow for attaching devices in direct thermal contact with the thermal pad 14 using solder, heat-conductive epoxy, thermally enhanced adhesives, etc., again such as copper.

A heat generating device package 16 is surface mounted to the substrate 12 in thermal communication with the thermal pad 14. As shown, the heat generating device package 16 is mounted in direct thermal contact with the thermal pad 14. In this configuration, the thermal pad 14 must be large enough to extend beyond the outer dimensions of the heat generating electronic device package 16 to allow for the mounting of heat sink mounting attachment 18. Mounting attachment 18 is shown with two support members, a first support member 20 and a second support member 22, although any number of support members could be used. The first and second support members 20, 22 support the body 24 of the mounting attachment 18 generally parallel to the plane of the substrate 12. Preferably, the mounting attachment 18 has a perforate body 24, as shown, in order to reduce the mass of the mounting attachment thereby making it easier to heat and reflow solder during the assembly process. A perforate body 24 also provides apertures for a robot to easily pick and place the mounting attachment 18 during assembly. As used herein, the description perforate body shall include, but not be limited to, a body having apertures, holes, bores, slots, slits, channels, indentations, or other penetrations through or formations in the body.

The first support member 20 of the mounting attachment 18 is formed in a generally U-shaped configuration comprising three portions: a first leg 26 extending from said body 24 of said mounting attachment 18, a first foot 28 extending generally perpendicularly from said first leg 26, and a first spring clip 30 extending generally upwardly from said first foot 28. Similarly, the preferred second support member 22 is also formed in a generally U-shaped configuration comprising a second leg 32, a second foot 34, and a second spring clip 36, similarly configured. The feet 28,34 of the support members 20,22 are soldered in direct thermal contact with the thermal pad 14 during the manufacturing assembly process. Accordingly, the feet 28,34 must be formed in whole or in part of a solderable material such as copper. Alternatively, the support members 20,22 mounting attachment 18 may be adhesively attached to the thermal pad with heat conductive epoxy or other thermally enhanced adhesives.

The generally U-shaped configuration of each support member 20,22 forms a receptacle, socket, or seat for extensions 38 of the heat sink 40. The heat sink 40 is placed in thermal communication with the mounting attachment 18 by pressing the extensions 38 of the heat sink 40 into the support members 20,22 between the legs 26,32 and the spring clips 30,36. The spring clips 30,36 of the support members 20,22 are formed with an angle 42 to ensure intimate physical contact with the extensions 38 of the heat sink 40. The support members 20,22 may also be formed arcuate to ensure a good physical contact between the heat sink extension 38 and the spring clips 30,36 of the support members 20,22. Similarly, the legs 26,32 of the support members 20,22 are shown with an angle 44 to ensure good physical contact with the heat sink extensions 38. The legs 26,32 may also be formed arcuate. Additional angles may also be added to the legs 26,32 or spring clips 30,36 to allow for increased surface area for contacting the extensions 38 of the heat sink 40. By increasing the contacted surface area between the support members 20,22 and the heat sink extensions 38, a larger thermal path is created from the mounting attachment 18 to the heat sink 40, thereby allowing for more efficient and effective transfer of heat from the mounting attachment 18 to the heat sink 40. As used herein, "thermal path" refers to the path along which, or heat conductive material through which, the heat is transferred from the heat generating device 16 to the heat dissipating device 40.

As a result of the foregoing configuration, the support members 20,22 provide a direct thermal connection between the heat sink 40 and the thermal pad 14, while the thermal pad 14 is in turn in direct thermal communication with the heat generating device package 16. This provides an effective thermal path from the heat generating electronic device 16 to the heat sink 40, while allowing for the post-manufacture installation and exchange of heat sinks. It should be noted that any number of mating support members 20,22 and heat sink extensions 38 can be used to thermally connect the heat sink 40.

A locking mechanism may be incorporated into the mounting assembly 10 to ensure the heat sink 40 does not separate from the mounting attachment 18. By incorporating features 46 in the heat sink extensions 38 and mating detents 48 in the support members 20,22, a simple releasable locking mechanism is obtained. When the heat sink extensions 38 are inserted into the support members 20,22, the detents 48 engage the features 46 to removably secure the heat sink 40 to the mounting attachment 18. The present invention contemplates the use of any number of other mating features on the heat sink 40 and the mounting attachment 18 including slots, apertures, indentations, channels, detents, lips, latches, etc.

Figure 2A:
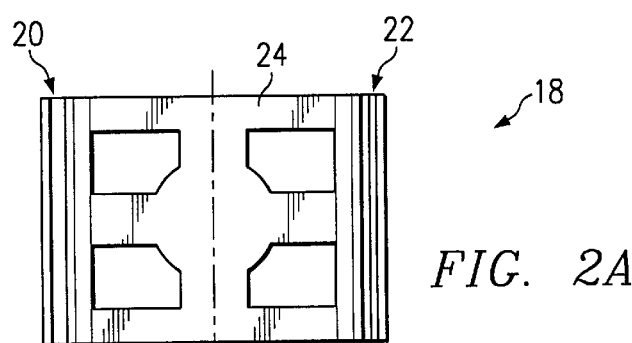
FIG. 2 is a multiple perspective view showing the top, front, and side view of an embodiment of the mounting attachment of the present invention.
Figure 2B:
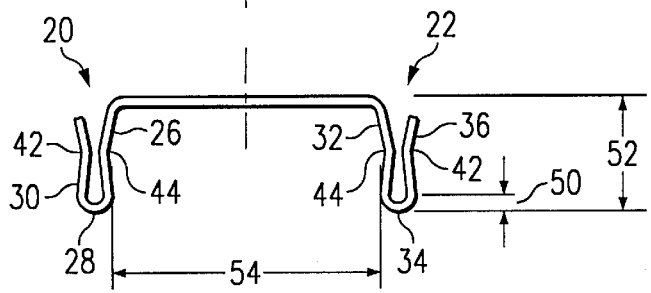
Figure 2C:
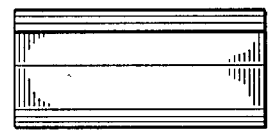

FIG. 2 shows a multiple perspective view of an embodiment of the mounting attachment 18. In particular, FIG. 2A shows the top view, FIG. 2B shows the front view, and FIG. 2C shows the side view. As shown in FIG. 2A, the mounting attachment 18 has a perforate body 24. Incorporating perforations or apertures in the body 24 assists in the robotic assembly of the mounting assembly 10. In addition, a perforate body 24 reduces the mass of the mounting attachment 18 thereby facilitating the heating of the mounting attachment 18 to reflow solder during assembly. It should be noted, however, that enough material must remain in the body 24 between the support members 20,22 to provide adequate stability to the mounting attachment 18. In addition, when the heat sink 40 is attached to the mounting attachment 18 via the support members 20,22, the body 24 can also be used to thermally engage the heat sink 40 by resting the heat sink 40 in thermal contact with the body 24 of the mounting attachment 18. Alternatively, if the heat sink 40 is supported above the body 24 of the mounting attachment 18, the apertures in the perforate body 24 provide air flow to the bottom of the heat sink 40 adjacent the mounting attachment 18.

FIG. 2B shows a front view of the mounting attachment 18 with the first support member 20 and the second support member 22 extending generally downward from the body 24 of the mounting attachment 18. The first support member 20 of the mounting attachment 18 is formed in a generally U-shaped configuration comprising three portions: a first leg 26 extending generally downward and perpendicular from said body 24 of said mounting attachment 18, a first foot 28 extending substantially perpendicular from said first leg 26, and a first spring clip 30 extending generally upward and perpendicular from said first foot 28. Similarly, the preferred second support member 22 is also formed in a generally U-shaped configuration comprising a second leg 32, a second foot 34, and a second spring clip 36, similarly configured. The spring clips 30,36 of the support members 20,22 are formed with an angle 42 to ensure intimate physical contact with the heat sink extensions 38. The spring clips 30,36 may also be formed arcuate to ensure a good physical contact between the heat sink extension 38 and the spring clips 30,36 of the support members 20,22. Similarly, the legs 26,32 of the support members 20,22 are shown with an angle 44 to ensure good physical contact with the heat sink extensions 38. The legs 26,32 may also be formed arcuate. In order to solder the feet 28,34 in direct thermal contact with the thermal pad 14 during the assembly manufacturing process, a portion 50 of the support members 20,22 must be formed in whole or in part of a solderable material such as copper.

FIG. 2 denotes some critical dimensions of the mounting attachment 18 in order to configure the mounting assembly 10 as shown in FIG. 1. In particular, the height 52 of the mounting attachment 18, and thus the corresponding height 52 of the support members 20,22, must be greater than or equal to the height of the heat generating electronic device package 16 when surface mounted to the substrate 12. If the height 18 is equal to the height of the heat generating electronic device package 16, the body 24 of the mounting attachment 18 will directly contact the upper surface of the electronic device package 16. This may provide a larger thermal path to transfer heat from the electronic device package 16 to the mounting attachment 24. Alternatively, if the height is greater than that of the heat generating device package 16, this configuration will allow for air flow between the mounting attachment 18 and the device package 16 thus increasing the surface area for heat dissipation from convection cooling.

Similarly, the width 54 of the mounting attachment 18 between the support members 20,22, and thus the corresponding width 54 of the body 24 of the mounting attachment 18, must be greater than or equal to the width of the heat generating electronic device package 16 when surface mounted to the substrate 12. As with the height, if the width is equal to the width of the heat generating device 16, the mounting attachment 18 will be in direct thermal contact with the device 16. If the width is greater than the width of the heat generating device 16, this configuration will allow for air flow between the mounting attachment 18 and the device 16 thus increasing the surface area for heat dissipation from convection cooling.

FIG. 2C shows a side view of the mounting attachment 18 and support member 22. In this embodiment, the spring clips 30,36 are slightly shorter than legs 26,32. Embodiments wherein the spring clips 30,36 are taller than the legs 26,32 and also contemplated by the present invention.

Figure 3:
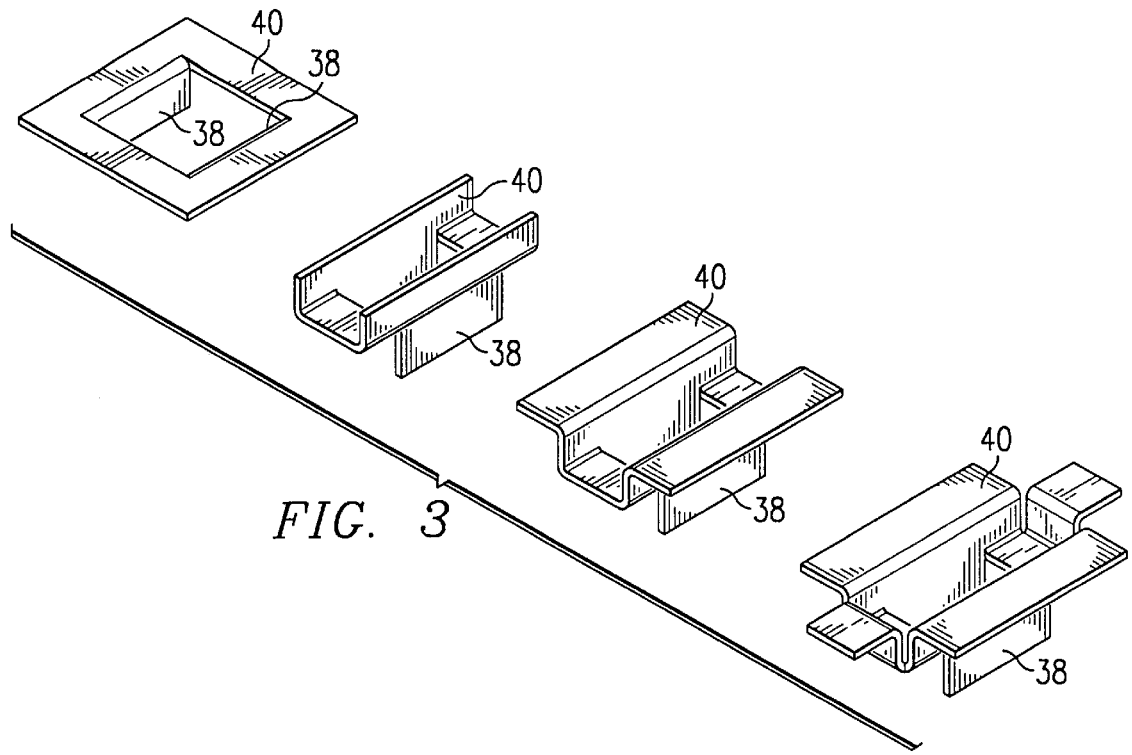
FIG. 3 is a perspective view of various heat sinks for the mounting assembly of the present invention.

As noted, one purpose of the present invention is to provide for the post-manufacture installation and exchange of different sized and shaped heat sinks. FIG. 3 shows various forms and shapes of heat sinks 40 contemplated. Each heat sink has a different mass or surface area. By exchanging heat sinks of differing mass and surface area, one can obtain varying rates and amounts of heat dissipation. The heat sinks 40 each have extensions 38 to insert into support members 20,22 of the mounting attachment 18. The heat sinks 40 may be manufactured in any fashion so long as the heat sink 40 incorporates an extension 38 to engage the support members 20,22 of the mounting attachment 18. Methods of manufacturing heat sinks include, but are not limited to, stamping, extrusion, molding, sawing, and forming. The extensions 38 of the various heat sink embodiments are shown as walls or solid fins, however, these extensions may be noncontiguous pins to increase the compliance of the extensions allowing for tolerance deviations in the support members 20,22 of the mounting attachment 18.

Figure 4:
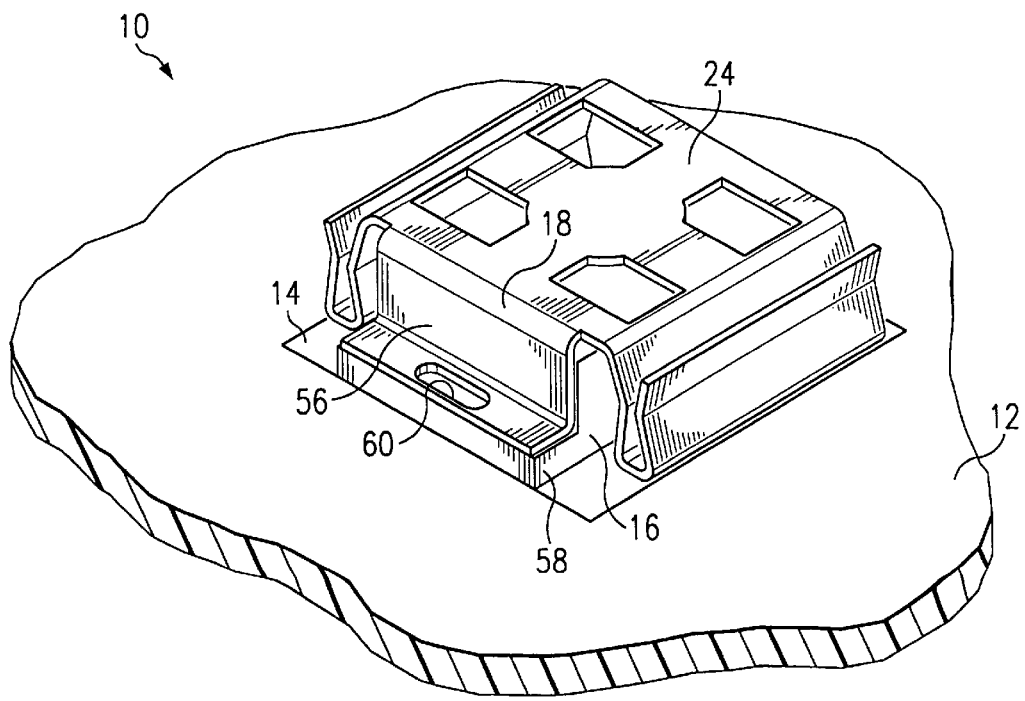
FIG. 4 is a perspective view of an alternate embodiment of the mounting assembly of the present invention.

FIG. 4 shows an alternative embodiment of the mounting assembly 10. The substrate 12, the thermal pad 14, the heat generating device package 16, and a majority of the mounting attachment 18 are the same as shown in FIG. 1. The mounting attachment 18, however, further comprises an overhang 56 extending from the body 24 of the mounting attachment 18. The overhang 56 is formed such that a portion thereof is generally parallel and adjacent to a heat dissipating tab 58 of the heat generating electronic device 16. The overhang 56 is in direct thermal contact with the heat dissipating tab 58 and may be secured by solder. To facilitate the manufacturing process, a solder supply, such as a solder bead, solder plug, or glob of solder paste, may be placed in an aperture 60 formed in the portion of the overhang 56 parallel with the tab 58 of the heat generating device package 16. When the mounting assembly 10 is heated to reflow the solder for the manufacturing assembly process, the solder plug in the aperture 60 will reflow thereby soldering the overhang 56 to the tab 58 of the heat generating electronic device package 16. The size of the tab 58 of the heat generating device 16 will determine the proper amount of solder to be used in order to adequately secure the overhang 56 to the tab 58 without having any runoff of excess solder. The overhang 56 provides an additional thermal connection to the heat generating device package 16 and thereby provides an increased thermal path to conduct heat away from the heat generating electronic device package 16, through the mounting attachment 18 and to the heat sink 40 for dissipation.

While the invention has been particularly shown and described with respect to specific embodiments thereof, it is to be understood that various changes in form and detail may be made hereto without departing from the spirit and scope of the present invention and shall be encompassed within the scope of the appended claims.

What is claimed is:

1. A heat sink mounting assembly, comprising:
   a substrate;
   a thermal pad supported by said substrate;
   a heat generating device package surface mounted to said substrate, thermally coupled to said thermal pad;
   a heat sink mounting attachment mounted to said substrate thermally coupled to said thermal pad, having a body supported above said substrate by two support members extending generally downward from said body, each said support member comprising a leg extending from said body, a foot extending substantially perpendicular from said leg, and a spring clip extending generally upward from said foot; and
   a heat sink having at least one extension, thermally coupled to said mounting attachment by sliding said extension into said support member, biasing said leg and said spring clip of said support member such that the heat sink extension is held between said leg and said spring clip.

2. The mounting assembly of claim 1, wherein said substrate is generally planar and said body of said mounting attachment is supported generally parallel to the plane of said substrate and above said heat generating device package.

3. The mounting assembly of claim 1, wherein the body of said mounting attachment is a perforate body to allow robotic pick and placement of the mounting attachment during assembly and to reduce the mass of said mounting attachment to allow for easy heating to reflow solder during the assembly process.

4. The mounting assembly of claim 1, wherein said heat sink extension has a feature formed therein and said support member of said mounting attachment has a mating detent formed therein, such that when said heat sink extension is inserted into said support member said detent will engage said feature to secure said heat sink to said mounting attachment.

5. The mounting assembly of claim 1, wherein said support member of said mounting attachment has a feature formed therein and said heat sink extension has a mating detent formed therein, such that when said heat sink extension is inserted into said support member said detent will engage said feature to secure said heat sink to said mounting attachment.

6. The mounting assembly of claim 1, wherein said mounting attachment further comprises an overhang extending from said body of said mounting attachment, and said heat generating electronic device further comprises a tab, wherein said overhang is thermally coupled to said tab.

7. The mounting assembly of claim 6, wherein a portion of said overhang of said mounting attachment is substantially parallel to said tab of said heat generating electronic device.

8. The mounting assembly of claim 1, wherein said extension of said heat sink comprises a leg, a foot, and a spring clip in a generally U-shaped configuration, and said support member comprises a generally planar member, wherein said support member is thermally coupled to said extension by sliding said support member into said extension thereby biasing said leg and said spring clip of said extension such that said support member is held therebetween.

9. The mounting assembly of claim 1, wherein the height of said support members is such that the body of said heat sink mounting attachment is supported in direct thermal contact with the upper surface of the heat generating device package.

10. The mounting assembly of claim 1, wherein the width of the body of said heat sink mounting attachment is such that the legs of said support members are in direct thermal contact with the heat generating device package.

11. A heat sink mounting attachment for releasably securing a heat sink to a printed circuit board in thermal communication with a heat generating electronic device, comprising:

a body;

a leg extending substantially downward and perpendicular from said body;

a foot extending substantially perpendicular from said leg;

a spring clip extending substantially upward and perpendicular from said foot;

wherein said foot is adapted to surface mount to a thermal pad on a substrate; and wherein said leg and said spring clip are separated by a distance sufficient to accept an extension from a heat sink such that said spring clip and said leg are biased against the extension of a heat sink.

12. The mounting attachment of claim 11, wherein said support member of said mounting attachment has a detent formed therein and said heat sink extension has a mating feature formed therein, such that when said heat sink extension is inserted into said support member said detent will engage said feature to secure said heat sink to said mounting attachment.

13. The mounting attachment of claim 11, wherein said support member of said mounting attachment has a feature formed therein and said heat sink extension has a mating detent formed therein, such that when said heat sink extension is inserted into said support member said detent will engage said feature to secure said heat sink to said mounting attachment.

14. The mounting attachment of claim 11, further comprising an overhang extending from said body and shaped such that a surface of said overhang can be thermally coupled to a heat dissipating tab of a heat generating electronic device.

15. The mounting assembly of claim 11, wherein said support member of said mounting attachment has a detent formed therein and said heat sink extension has a mating feature formed therein, such that when said heat sink extension is inserted into said support member said detent will engage said feature to secure said heat sink to said mounting attachment.

16. The mounting assembly of claim 11, wherein said support member of said mounting attachment has a feature formed therein and said heat sink extension has a mating detent formed therein, such that when said heat sink extension is inserted into said support member said detent will engage said feature to secure said heat sink to said mounting attachment.

17. The mounting assembly of claim 11, further comprising an overhang extending from said body adapted to thermally connect to the heat dissipating tab of a heat generating electronic device.

18. A heat sink mounting assembly, comprising:

a substrate;

a thermal pad supported by said substrate;

a heat generating device package surface mounted to said substrate having a heat dissipating tab, said heat generating device thermally coupled to said thermal pad;

a heat sink mounting attachment surface mounted to said substrate in thermal communication with said thermal pad, having a body supported above said substrate by at least one support member extending from said body;

an overhang extending from said body of said mounting attachment thermally connecting said mounting attachment to said tab of said heat generating electronic device; and a heat sink thermally coupled to said mounting attachment.

19. The mounting assembly of claim 18, wherein a portion of said overhang of said mounting attachment is substantially parallel to said tab of said heat generating electronic device package.

20. The mounting assembly of claim 19, wherein said portion of said overhang of said mounting attachment substantially parallel to said tab of said heat generating electronic device package is soldered to said tab of said device package.

21. A heat sink mounting attachment for releasably securing a heat sink to a printed circuit board in thermal communication with a heat generating electronic device, comprising:

a body;

a leg extending downward and substantially perpendicular from said body;

a foot extending substantially perpendicular from said leg;

a spring clip extending upward and substantially perpendicular from said foot;

wherein said foot is adapted to surface mount to a thermal pad on a substrate; and wherein said leg and said spring clip are separated by a distance sufficient to accept an extension from a heat sink such that said spring clip and said leg are biased against the extension of a heat sink.

22. A heat sink mounting assembly, comprising:

a substrate;

a thermal pad supported by said substrate;

a heat generating device package surface mounted to said substrate having a heat dissipating tab, said heat generating device thermally coupled to said thermal pad;

a heat sink mounting attachment surface mounted to said substrate in thermal communication with said thermal pad, having a body supported above said substrate by at least one support member extending from said body;

an overhang extending from said body of said mounting attachment thermally connecting said mounting attachment to said tab of said heat generating device package; and a heat sink thermally coupled to said mounting attachment.

* * * * *